United States Patent [19]

Patron

[11] Patent Number: 4,954,792
[45] Date of Patent: Sep. 4, 1990

[54] MULTI-GRID ELECTRON TUBE HIGH FREQUENCY POWER OSCILLATOR

[75] Inventor: Christian S. A. E. Patron, Eindhoven, Netherlands

[73] Assignee: U.S. Philips Corporation, New York, N.Y.

[21] Appl. No.: 394,342

[22] Filed: Aug. 15, 1989

[30] Foreign Application Priority Data

Aug. 17, 1988 [NL] Netherlands ............... 8802035

[51] Int. Cl.$^5$ .................. H03B 1/02; H03B 5/10
[52] U.S. Cl. .................. 331/169; 331/173; 331/183; 331/185
[58] Field of Search ............... 331/167–171, 331/173, 183, 185

[56] References Cited

U.S. PATENT DOCUMENTS

| | | | |
|---|---|---|---|
| 3,331,031 | 7/1967 | Nawracaj et al. | 331/173 X |
| 4,761,618 | 8/1988 | Patron et al. | 331/167 |
| 4,884,043 | 11/1989 | Patron et al. | 331/186 |
| 4,897,619 | 1/1990 | Patron et al. | 331/167 |

Primary Examiner—Siegfried H. Grimm
Attorney, Agent, or Firm—Bernard Franzblau

[57] ABSTRACT

A high-frequency power oscillator includes a tetrode electron tube (5), a current source (3) and a voltage-limiting circuit (4). The current source (3) is connected to the screen grid of the tetrode (5). This limits the screen grid current when the voltage on the anode of the tetrode (5) is momentarily lower than the screen grid voltage. Between the screen grid and the cathode of the tetrode the voltage-limiting circuit (4) is inserted. This circuit starts to conduct above a predetermined threshold value. This forms a limit to the screen grid voltage so that is is possible to operate the tetrode (5) in a pulsating manner. The voltage-limiting circuit may comprise a triode (4) with a voltage source (2) providing a constant voltage between the grid and the cathode of the triode (4).

7 Claims, 1 Drawing Sheet

MULTI-GRID ELECTRON TUBE HIGH FREQUENCY POWER OSCILLATOR

BACKGROUND OF THE INVENTION

This invention relates to a high-frequency power oscillator comprising a multi-grid electron tube which includes at least a control grid, a screen grid and a cathode.

Such a high-frequency power oscillator is known from Dutch Patent Application No. NL 8600673 (U.S. Pat. No. 4,761,618). This known high-frequency power oscillator comprises a tetrode as an active element. When a tetrode is customarily used as an amplifying element in an oscillator circuit, the control grid is voltage controlled, while the control voltage may be superposed on a direct voltage for setting the control grid. The screen grid is then set to a fixed voltage value. Such a tetrode setting is also known from the above Dutch patent application.

One generally aims at achieving the highest possible power efficiency (i.e. the ratio between the a.c. power tapped from the anode and the d.c. power supplied to the anode) of an electron tube operating as an amplifier in a power oscillator. High efficiency is of major importance because the loss of energy is converted into heat. Since large powers are supplied and discharged with this type of electron tube, a considerably amount of heat in the anode of the electron tube will have to be dissipated in case of low efficiency. If this heat is not dissipated the electron tube will be destroyed.

In order to obtain maximum efficiency it is thus necessary for the a.c. voltage amplitude to have the same value as the d.c. voltage across the anode of this electron tube. This implies that the overall anode voltage (thus the sum of the a.c. and the d.c. voltages) can instantaneously become practically equal to zero volts. A known property of a multi-grid electron tube is the fact that when the anode voltage drops below the screen grid voltage, the anode current will decrease and the screen grid current will increase accordingly. Owing to this increase of the screen grid current the power dissipation in the screen grid will be enhanced, leading to a possible destruction of the screen grid.

In order not to cause a detrimental effect on the efficiency, it is desired to operate with a pulsating control of the control grid of the electron tube. When the electron tube is fully open or closed the heat dissipation will be low. In the former situation the heat dissipation will be low because the anode voltage is then momentarily zero and in the latter situation because the anode current is zero. Since both the anode voltage and the anode current are unequal to zero during the transitional period between the open and closed conditions of the electron tube and, consequently, much heat is dissipated, it is of major importance that the pulses have the steepest possible edges. Furthermore, steep edges enhance a proper definition of the pulse duration. A well-defined pulse duration is important for obtaining a balanced power control in cases of high pulse frequencies and different pulse durations.

SUMMARY OF THE INVENTION

It is an object of the invention to provide a high-frequency power oscillator having a high power efficiency and wherein the power is controllable by operating a multi-grid electron tube in a pulsating fashion.

For this purpose, the high-frequency power oscillator according to the invention is characterised in that the high-frequency power oscillator comprises a constant current source which is connected to the screen grid and includes a voltage-limiting circuit of which one terminal is connected to the screen grid and of which another terminal is connected to the cathode, which voltage-limiting circuit shows a low impedance for a voltage difference between the two said terminals above a preset threshold value and shows a high impedance for a voltage difference below this threshold value.

By implementing the measures according to the invention the values that may be assumed by the screen grid current and the screen grid voltage are limited.

The current source limits the current supply to the screen grid as a result of which the screen grid dissipation does not assume any detrimental value.

The constant current supplied to the screen grid by the current source is discharged to the cathode through the electron tube when the latter is conductive. When the electron tube is operated in a pulsating manner efforts are made to render it non-conductive by forcing the voltage on the control grid to drop. Even in this situation it should be possible to discharge the continuous current supplied by the current source. If this were no longer possible, the screen grid voltage would consequently rise considerably. This rise of the screen grid voltage thwarts the effect that the decrease of the control grid voltage has on the electron tube current. Consequently, rendering the electron tube non-conductive via the control grid by means of a voltage value customary for this purpose becomes impossible. This is caused by the continued effect of the screen grid voltage on the electric field at the cathode surface. By introducing a voltage-limiting circuit according to the invention between the screen grid and the cathode of the electron tube it is achieved that the screen grid voltage is limited. Since the voltage-limiting circuit is rendered conductive at a specific value of the screen grid voltage, the thwarting effect of the screen grid voltage on the control grid voltage is limited such that now it is possible indeed to render the electron tube non-conductive. Once the screen grid voltage exceeds a preset threshold value, the voltage-limiting circuit will start to conduct. The current of the current source is then discharged via this circuit. During the conductive period of the voltage-limiting circuit the screen grid voltage will remain practically equal to the threshold value. The dissipation is now limited additionally because the screen grid current as well as the screen grid voltage remain limited.

A proper limitation of the screen grid voltage is obtained by having the voltage-limiting circuit comprise an element which is conductive above a preset threshold value. Specifically suitable for this purpose is a triode comprising a grid and a cathode where the voltage between the grid and the cathode is set at a fixed value. The grid has a negative value relative to the cathode. A general feature of a triode used as a switching element is the fact that the influence of the anode voltage on the electric field of the cathode is $\mu$ times as small as the influence of the grid voltage on the field of the cathode (where $\mu$ is called the gain factor). From this it follows that the triode does not conduct until the anode voltage is at least $\mu$ times as large as the grid voltage.

It should be observed that from the above Dutch patent application a transistor is known to be inserted between the screen grid and the cathode of the electron tube. In the above application, however, the transistor is set in a linear gain zone to control the output power of the high-frequency power oscillator. A variable-amplitude control signal is applied to the base of the transistor. The triode in the power oscillator according to the invention, however, is set either to conduct or block completely so that the triode is used as a switching element. In contradistinction to the transistor the grid voltage of the triode always has a constant value.

BRIEF DESCRIPTION OF THE DRAWING

The invention and its advantages will now be further explained with reference to the drawing, in which corresponding elements in the Figures have been referenced by the same symbols, and in which.

DESCRIPTION OF THE PREFERRED EMBODIMENTS

The high-frequency power oscillators shown in these Figures can, for example, be used in plasma torches or for biassing lasers. They are specifically used for operating in a pulsating fashion flash light generators having large powers of, for example, 100 kWatts. These flash light generators generate light beams for activating lasers in a pulsating manner.

Figure 1:
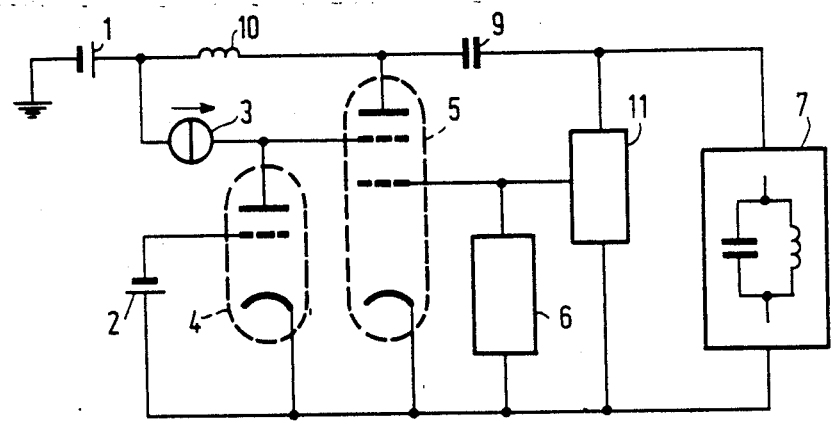
FIG. 1: shows a diagrammatic representation of the high-frequency power oscillator according to the invention.

The high-frequency power oscillator shown in FIG. 1 comprises a current source 3, a triode 4, a mult-grid electron tube 5 arranged as a tetrode and a frequency-determining circuit 7.

The cathode of tetrode 5 is connected to a fixed reference voltage, to be referred to as ground hereinafter.

Between the control grid and the cathode of tetrode 5 a control circuit 6 is inserted so as to switch the tetrode 5 to an open or closed position by controlling the control grid. The anode of tetrode 5 is connected to a d.c. voltage source 1 via an inductance coil 10. The d.c. voltage source 1 supplies a high voltage of, for example, 10 kV. By means of inductance coil 10 it is avoided that the a.c. signal at the anode of tetrode 5 leaks to ground via the d.c. voltage source 1.

The d.c. voltage source 1 is also connected to one side of current source 3. The other side of the current source is connected to the screen grid of tetrode 5 and to the anode of triode 4. The cathode of triode 4 is connected to the cathode of tetrode 5. Between the cathode and the grid of triode 4 a voltage source 2 is inserted which renders the grid negative relative to the cathode of triode 4.

The oscillator frequency of the power oscillator is determined by means of a frequency-determining circuit 7. As symbolically shown in FIG. 1, this circuit 7 comprises, as is customary, an oscillation circuit comprising an inductive and a capacitive element. One side of circuit 7 is connected to the cathode of tetrode 5. Between the other side of circuit 7 and the anode of tetrode 5 a blocking capacitor 9 is inserted for blocking an anode d.c. current.

A feedback circuit 11 is arranged in parallel with the frequency-determining circuit 7. A first terminal of the feedback circuit is connected to the junction of the blocking capacitor 9 and the frequency-determining circuit 7 and a second one to ground. A third terminal of feedback circuit 11 is connected to the control grid. Via the feedback circuit 11 the a.c. signal on the anode of tetrode 5 is fed back in phase opposition to the control grid. Owing to this feedback oscillation occurs in the power oscillator.

Tetrode 5 is preferably rendered conductive and non-conductive by means of a control signal from control circuit 6 applied to the control grid of tetrode 5 so that the a.c. power on the anode of tetrode 5 is controlled by means of this control signal. When the voltage on the anode of tetrode 5 is lower than the screen grid voltage, without any further measures being taken practically the whole tetrode current would flow to the screen grid. In order to avoid a resultant destruction of the screen grid, current source 3 is connected to the screen grid so as to limit this current to the screen grid. In order to limit the screen grid voltage the triode 4 is connected to the screen grid of tetrode 5. Triode 4 becomes conductive once the screen grid voltage exceeds a preset threshold value. This threshold value is determined by the voltage of voltage source 2 combined with the gain factor of triode 4. Thus when the voltage on the control grid of tetrode 5 is controlled down, the voltage on the screen grid will rise to a maximum of the said threshold value as a consequence of the current supplied by current source 3. This restricts the counteracting effect of the screen grid voltage on the control grid voltage and enables it to render the tetrode 5 non-conductive.

Figure 2:
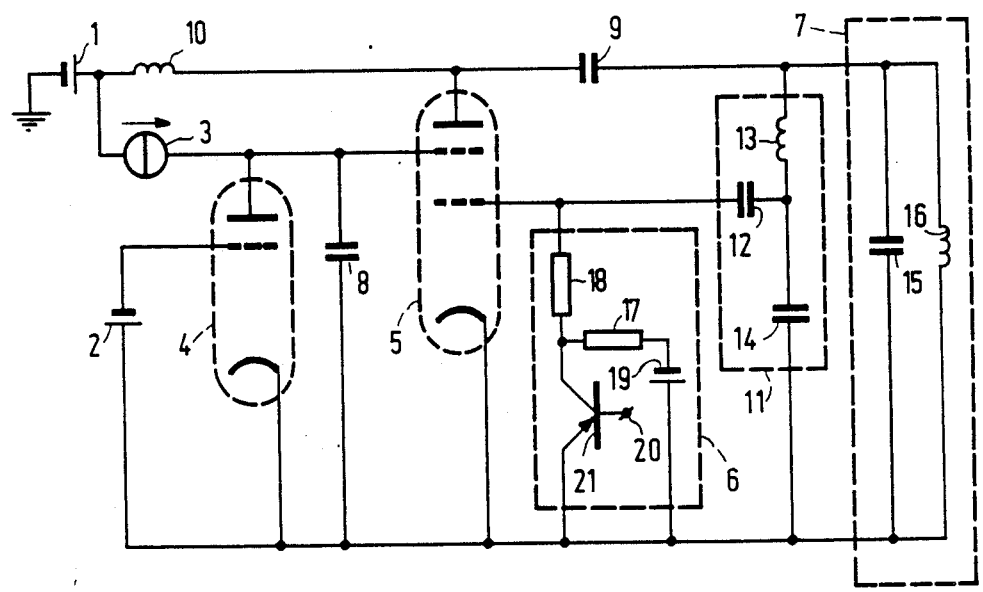
FIG. 2: shows a more detailed circuit diagram of the high-frequency power oscillator according to the invention.

The basic operation of the high-frequency power oscillator according to the invention is explained with reference to FIG. 1. In FIG. 2 a more detailed embodiment of the high-frequency power oscillator of FIG. 1 is represented.

The power oscillator of FIG. 2 comprises a capacitor 8 having one side connected to the screen grid and the other side connected to the cathode of tetrode 5. The frequency-determining circuit 7 comprises a parallel circuit of a capacitor 15 and a coil 16, which circuit defines an oscillation frequency of, for example, 30 MHz. Feedback circuit 11 comprises a capacitor 12 and a series arrangement of a coil 13 and a capacitor 14. The capacitor 14 is connected to ground and the coil 13 is connected to the junction of blocking capacitor 9 and the frequency-determining circuit 7. The junction of coil 13 and capacitor 14 is connected to one side of the capacitor 12. The other side of capacitor 12 is connected to the control grid of tetrode 5.

The control grid of tetrode 5 is set, as is customary in an oscillator, at a negative value relative to the cathode of tetrode 5 by means of the automatic grid bias to be described hereinafter. Voltage source 19 is connected to the control grid through a series arrangement of two resistors 17 and 18. One terminal of the voltage source 19 is connected to one side of resistor 17 forming one end of the series arrangement and the other terminal of voltage source 19 is connected to ground. One side of resistor 18 forming the other end of the series arrangement is connected to the junction of the control grid of tetrode 5 and capacitor 12. The junction of the resistors 17 and 18 is connected to the collector of a transistor 21. The emitter of this transistor 21 is connected to ground. The base of transistor 21 forms the input to the power oscillator for controlling the output power.

By means of a pulse signal on input 20 the transistor 21 is rendered conductive or non-conductive. If transistor 21 is rendered non-conductive, the control grid is rendered negative relative to the cathode by means of the voltage source 19. Tetrode 5 is rendered non-conductive as a result thereof. If transistor 21 is conductive, the control grid d.c. voltage will be set by means of the automatic control grid bias.

In this type of oscillator there is a possibility that parasitic oscillations occur. These parasitic oscillations are caused by a stray capacitance of, for example, 50 pF occurring between the anode and the screen grid of tetrode 5. Capacitor 8 has a large capacitance of the order of, for example, 1 nF relative to the stray capacitance. Consequently, the effect of the anode voltage on the screen grid voltage via the stray capacitance is reduced pratically in the proportion of the stray capacitance to this relatively large capacitance of capacitor 8. Owing to the presence of this relatively large capacitance with this type of oscillator there is preferably no high-frequency control of the screen grid.

A second reason for not employing high-frequency control of the screen grid lies in the fact that the screen grid is more distant from the cathode than the control grid. The voltage required for rendering tetrode 5 non-conductive via the screen grid is considerably higher than the required voltage applied via the control grid. Owing to this higher required screen grid voltage, rendering tetrode 5 conductive and non-conductive through the screen grid voltage will lead to larger voltage variations and related larger heat dissipation in the bias circuit than through the control grid voltage. Since the smallest possible heat dissipation is aimed at, it is the control grid which is preferably controlled.

The series arrangement of coil 13 and capacitor 14 is used for a suitable feedback of the a.c. signal on the anode of tetrode 5 to the control grid of tetrode 5. The coil 13 and capacitor 14 cause a 180 degrees phase shift so that the a.c. signal on the anode of tetrode 5 is in phase opposition to the signal on the control grid. Consequently, oscillation is possible.

The capacitor 12 blocks the d.c. voltage on the control grid so that no d.c. current flows to ground through the coils 13 and 16. If capacitor 12 were absent, an amount of energy would be dissipated in the control grid during the discharging of the d.c. current to ground such that the control grid would consequently be destroyed.

Capacitor 12 is likewise used for the aforementioned automatic d.c. biassing of the control grid. The signal pulses appearing at the control grid cause a current to flow to the control grid. Capacitor 12 is charged as a result of this current pulse from the control grid. Subsequent to the current pulse on the control grid capacitor 12 is partly discharged through resistor 18. A condition of balance develops once the charge which is applied to capacitor 12, by means of the current pulses of the control grid, is equal to the charge which is discharged through resistor 18. Resistor 18 and capacitor 12 operate chiefly as a low-pass filter. If the values of resistor 18 and capacitor 12 are chosen such that the R-C time of this low-pass filter exceeds by far the period of the signal on input 20, the voltage across capacitor 12 will be subject to minor variations as a result of the signal on input 20. Thus a d.c. voltage is applied to the control grid. When the amplitude of the oscillator signal, that is, of the signal pulses on the control grid, is increased, the charge applied to capacitor 12 will increase. In order to achieve a new state of balance, the discharge current through resistor 18 should increase as well. Therefore, the amplitude of the d.c. voltage of the control grid will be reduced such that the charge discharged through resistor 18 is again equal to the charge applied to capacitor 12. As a result of the drop in the d.c. voltage of the control grid, the amplitude of the signal pulses will be reduced. The above arrangement thus has a stabilizing effect on the amplitude of the oscillator signal at the control grid.

A pulse signal of, for example, 50 kHz can be applied to the control input 20. With this pulse signal tetrode 5 can be rendered conductive and non-conductive. By varying the pulse duration the power on the anode of tetrode 5 is adjusted.

I claim:

1. A high-frequency power oscillator comprising; a multi-grid electron tube which includes at least a control grid, a screen grid and a cathode, a constant current source connected to the screen grid, a voltage-limiting circuit having one terminal connected to the screen grid and another terminal connected to the cathode of the electron tube, said voltage-limiting circuit having a low impedance for a voltage difference between the two said terminals above a preset threshold value and a high impedance for a voltage difference below said threshold value.

2. A high-frequency power oscillator as claimed in claim 1, wherein the voltage-limiting circuit comprises a triode including a grid and a cathode, and means for setting the voltage between the grid and the cathode at a constant value.

3. A high-frequency power oscillator as claimed in claim 2 further comprising a control circuit coupled to the control grid of said electron tube to apply thereto a pulsatory voltage that drives said electron tube into conduction and into cut-off.

4. A high-frequency power oscillator as claimed in claim 3 further comprising means for coupling the anode and cathode of said electron tube to a source of DC operating voltage and second means for coupling said constant current source between said screen grid and one terminal of said DC voltage source.

5. A high-frequency power oscillator as claimed in claim 2 wherein said triode has an anode connected to the screen grid of the electron tube and said grid of the triode is set to a voltage level that maintains the triode in cut-off when the screen grid voltage is below said threshold value, said triode being switched into conduction when the screen grid achieves said threshold value.

6. A high-frequency power oscillator as claimed in claim 1 further comprising a control circuit coupled to the control grid of said electron tube to apply thereto a pulsatory voltage that drives said electron tube into conduction and into cut-off, said control circuit including means for varying the pulse duration so as to adjust the power level of said high-frequency oscillator.

7. A high-frequency power oscillator as claimed in claim 1 further comprising a control circuit coupled to the control grid of said electron tube to apply thereto a pulsatory voltage that drives said electron tube into conduction and into cut-off in response to a pulse-type signal at a control input of the control circuit, and a low pass R-C filter coupled to said control grid and having an RC time constant much higher than the period of said pulse-type signal.

* * * * *